US011111580B2

(12) United States Patent
Kang et al.

(10) Patent No.: US 11,111,580 B2
(45) Date of Patent: Sep. 7, 2021

(54) APPARATUS FOR PROCESSING SUBSTRATE

(71) Applicant: EUGENE TECHNOLOGY CO., LTD., Yongin-Si (KR)

(72) Inventors: Sung Ho Kang, Hwaseong-Si (KR); Chang Dol Kim, Yongin-Si (KR); Sang Don Lee, Yongin-Si (KR)

(73) Assignee: EUGENE TECHNOLOGY CO., LTD.

( * ) Notice: Subject to any disclaimer, the term of this patent is extended or adjusted under 35 U.S.C. 154(b) by 273 days.

(21) Appl. No.: 15/973,241

(22) Filed: May 7, 2018

(65) Prior Publication Data
US 2018/0355481 A1 Dec. 13, 2018

(30) Foreign Application Priority Data
Jun. 8, 2017 (KR) .......... 10-2017-0071633

(51) Int. Cl.
*C23C 16/455* (2006.01)
*C23C 16/44* (2006.01)
(Continued)

(52) U.S. Cl.
CPC .... *C23C 16/45546* (2013.01); *C23C 16/4412* (2013.01); *C23C 16/4584* (2013.01);
(Continued)

(58) Field of Classification Search
CPC .......... C23C 16/4583; C23C 16/45546; C23C 16/4584; C23C 16/46; C23C 16/45578;
(Continued)

(56) References Cited

U.S. PATENT DOCUMENTS

2010/0083898 A1 4/2010 Kogura et al.
2012/0199067 A1* 8/2012 Morozumi ........ H01L 21/67109
118/719
(Continued)

FOREIGN PATENT DOCUMENTS

CN 104916565 A 9/2015
JP H09148315 A 6/1997
(Continued)

OTHER PUBLICATIONS

English translation of JP 2006-80098, previously filed in IDS.*

*Primary Examiner* — Aiden Lee
(74) *Attorney, Agent, or Firm* — Renaissance IP Law Group LLP

(57) ABSTRACT

The present disclosure relates to an apparatus for processing a substrate, and more particularly, to an apparatus for processing a substrate, which is capable of allowing a substrate processing gas to smoothly flow on the substrate. The apparatus for processing the substrate in accordance an exemplary embodiment may form a laminar flow through a gas supply unit disposed on one side of an inner reaction tube and an exhaust duct disposed on the other side of the inner reaction tube, which faces the gas supply unit, to extend up to the outside of an accommodation region of a pedestal in an accommodation space of the inner reaction tube and control a flow of a substrate processing gas supplied onto the substrate.

12 Claims, 4 Drawing Sheets

(51) Int. Cl.
*C23C 16/458* (2006.01)
*C23C 16/46* (2006.01)

(52) U.S. Cl.
CPC .. *C23C 16/45504* (2013.01); *C23C 16/45578* (2013.01); *C23C 16/46* (2013.01)

(58) Field of Classification Search
CPC .......... C23C 16/45504; C23C 16/4412; C23C 16/45544; H01L 21/67011; H01L 21/67017; H01L 21/67098; H01L 21/67303; H01L 21/67306; H01L 21/67309; C30B 25/10; C30B 25/12; F27B 17/0025; F27B 1/00
USPC ................................. 118/715–733
See application file for complete search history.

(56) References Cited

U.S. PATENT DOCUMENTS

| | | | | |
|---|---|---|---|---|
| 2015/0270125 | A1* | 9/2015 | Sasaki | ............... H01L 21/02186 438/785 |
| 2016/0276206 | A1 | 9/2016 | Kaneko et al. | |
| 2017/0037512 | A1* | 2/2017 | Saido | .................. C23C 16/4408 |
| 2019/0017169 | A1* | 1/2019 | Hanashima | ....... H01L 21/67109 |
| 2020/0048768 | A1* | 2/2020 | Wiegers | ............ H01L 21/67109 |

FOREIGN PATENT DOCUMENTS

| | | |
|---|---|---|
| JP | H09213640 A | 8/1997 |
| JP | H09330884 A | 12/1997 |
| JP | 2004266090 A | 9/2004 |
| JP | 2006080098 A | 3/2006 |
| JP | 2010050439 A | 3/2010 |
| JP | 2012169307 A | 9/2012 |
| JP | 2012178492 A | 9/2012 |
| JP | 2014067783 A | 4/2014 |
| JP | 2015183224 A | 10/2015 |
| JP | 2018049853 A | 3/2018 |
| KR | 20150110419 A | 10/2015 |
| KR | 101668687 B1 | 10/2016 |
| KR | 20160122524 A | 10/2016 |
| KR | 101710944 B1 | 2/2017 |
| TW | 201324661 A | 6/2013 |

* cited by examiner

APPARATUS FOR PROCESSING SUBSTRATE

CROSS-REFERENCE TO RELATED APPLICATION

This application claims priority to Korean Patent Application No. 10-2017-0071633 filed on Jun. 8, 2017 and all the benefits accruing therefrom under 35 U.S.C. § 119, the contents of which are incorporated by reference in their entirety.

BACKGROUND

The present disclosure relates to an apparatus for processing a substrate, and more particularly, to an apparatus for processing a substrate, which is capable of allowing a substrate processing gas to smoothly flow on the substrate.

In general, a substrate processing apparatus is classified into a single wafer type substrate processing apparatus, which is capable of performing a substrate processing process on one substrate, and a batch type substrate processing apparatus, which is capable of performing a substrate processing process on a plurality of substrates at the same time. Such a single wafer type substrate processing apparatus has a simple structure, but has low productivity. Thus, the batch type substrate processing apparatus capable of being mass-producing substrates is being widely used.

In the batch type substrate processing apparatus in accordance with the related art, the substrate processing process is performed in a state in which a plurality of substrates are loaded in the multistage manner. The batch type substrate processing apparatus includes a reaction tube in which the substrate processing process is performed, a gas supply unit supplying a substrate processing gas into the reaction tube, and an exhaust unit exhausting a residual gas within the reaction tube. The substrate processing process using the batch type substrate processing apparatus is performed as follows. First, a plurality of substrates are loaded into the reaction tube. Next, the substrate processing gas is supplied into the reaction tube through the gas supply unit while exhausting the gas within the reaction tube through the exhaust unit. Then, the substrate processing gas injected through an injection nozzle of the gas supply unit forms a thin film on the substrate while passing between the substrates, and the residual gas is introduced into the exhaust unit through an exhaust hole and then exhausted.

However, in the case of the substrate processing apparatus in accordance with the related art, the substrate processing gas injected from the injection nozzle of the gas supply unit is introduced into the exhaust hole without being uniformly distributed on the entire area of the substrate. That is, since the exhaust hole has a narrow with to correspond to the injection nozzle, the substrate processing gas passing through an intermediate area of the substrate, which is disposed between the injection nozzle and the exhaust hole, may increase in flow rate, and the substrate processing gas passing through both side areas of the substrate may decrease in flow rate. Thus, a difference in thin film thickness between the intermediate area and each of both the side areas of the substrate may occur to deteriorate quality of the thin film or the substrate on which the thin film is formed.

SUMMARY

The present disclosure provides an apparatus for processing a substrate, in which a substrate process gas is controlled to uniformly flow on an entire area of the substrate and thereby to form a thin film having a uniform thickness on the entire area of the substrate.

In accordance with an exemplary embodiment, an apparatus for processing a substrate includes: an outer tube having an inner space; an inner reaction tube disposed to be spaced apart from an inner surface of the outer tube in the inner space of the outer tube and having an accommodation space therein; a substrate boat in which a plurality of substrates are loaded in a multistage manner and accommodated in an upper portion of the accommodation space of the inner reaction tube during substrate processing; a pedestal configured to support the substrate boat and accommodated in a lower portion of the accommodation space of the inner reaction tube during the substrate processing; a gas supply unit disposed on one side of the inner reaction tube; and an exhaust duct vertically extending from the other side of the inner reaction tube to provide an inner passage communicating with an exhaust hole defined to pass through a sidewall of the inner reaction tube and disposed in a spaced space between the inner reaction tube and the outer tube to face the gas supply unit, wherein the exhaust duct extends up to the outside of an accommodation region of the pedestal in the accommodation space of the inner reaction tube.

The exhaust hole may include: a first exhaust hole defined to correspond to an accommodation region of the substrate board in the accommodation space of the inner reaction tube; and a second exhaust hole defined to correspond to the accommodation region of the pedestal.

The first exhaust hole and the second exhaust hole may be defined to be spaced apart from each other.

The apparatus may further include an exhaust port communicating with the exhaust duct and disposed to correspond to the accommodation region of the pedestal, wherein the second exhaust hole may face the exhaust port.

The exhaust hole may have a slit shape extending in a circumferential direction of the inner reaction tube or a shape in which a plurality of through-holes are arranged along a circumference of the inner reaction tube.

The apparatus may further include a heating unit vertically extending outside the inner reaction tube to heat the inner reaction tube and extending up to the outside of the accommodation region of the pedestal.

The pedestal may include a plurality of thermal blocking plates spaced apart from each other and disposed in a multistage manner.

The gas supply unit may include a plurality of gas distribution lines vertically extending to distribute a supplied substrate processing gas or inert gas, the plurality of gas distribution lines may be disposed in a line along a circumference of the inner reaction tube to form a gas distribution line array, and the inert gas may be supplied to the plurality of gas distribution lines, which are symmetrical to each other with respect to a center of the gas distribution line array.

The substrate processing gas may be supplied to the gas distribution line disposed between the plurality of gas distribution lines, which are symmetrical to each other.

A flow rate of the inert gas may be adjusted in accordance with a distance between an inner surface of the inner reaction tube and a side portion of the substrate boat.

The substrate processing gas may include a source gas for forming a thin film and a reaction gas reacting with the source gas, and the source gas and the reaction gas may be sequentially supplied.

The substrate processing gas may include a source gas for forming a thin film and a reaction gas reacting with the source gas, and the source gas and the reaction gas may be separated from each other so as to be respectively supplied to the gas distribution lines different from each other.

The gas supply unit may further include a plurality of injection nozzles disposed on a circumferential surface of the gas distribution line and disposed in a line in a longitudinal direction of the gas distribution line, and an internal pressure difference of the gas distribution line in the longitudinal direction may be within a predetermined range during the substrate processing.

A material of the exhaust duct may include quartz, and the exhaust duct and the inner reaction tube may be provided as one body.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
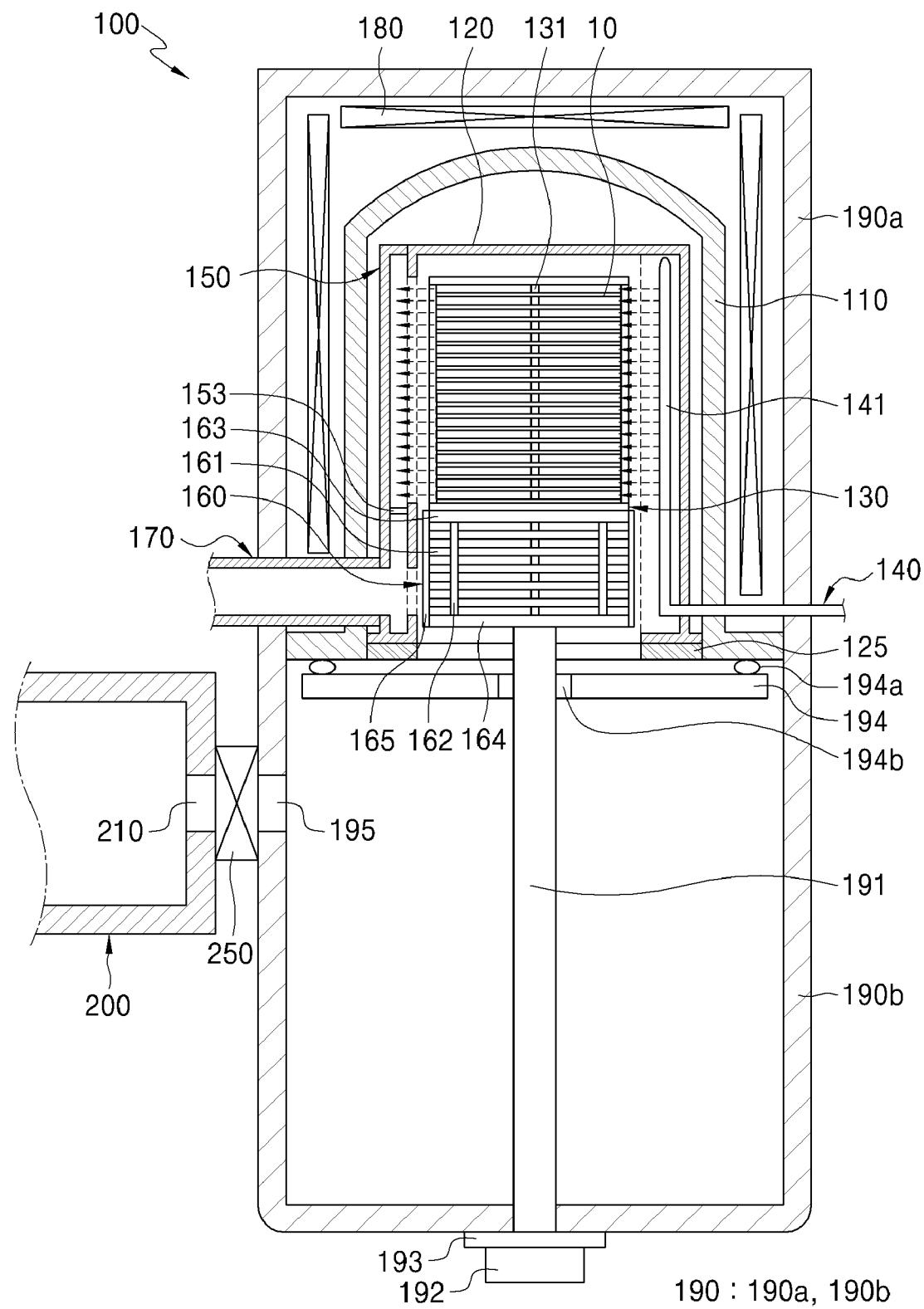
FIG. 1 is a cross-sectional view of an apparatus for processing a substrate in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a cross-sectional view of an apparatus for processing a substrate in accordance with an exemplary embodiment.

Referring to FIG. 1, an apparatus for processing a substrate (hereinafter, referred to as a substrate processing apparatus) may include an outer tube 110 having an inner space, an inner reaction tube 120 disposed to be spaced apart from an inner surface of the outer tube 110 in the inner space of the outer tube 110 and having an accommodation space, a substrate boat 130 on which a plurality of substrates 10 are loaded in a multistage manner and which is accommodated into an upper portion of the accommodation space of the inner reaction tube 120 when the substrate processing process is performed, a pedestal 160 supporting the substrate boat 130 and accommodated into a lower portion of the accommodation space of the inner reaction tube 120 when the substrate processing process is performed, a gas supply unit 140 disposed on one side of the inner reaction tube 120, and an exhaust duct 150 extending vertically from the other side of the inner reaction tube 120 to provide an inner passage communicating with exhaust holes 151 and 152 defined to pass through sidewalls of the inner reaction tube 120 and disposed in a spaced space between the inner reaction tube 120 and the outer tube 110 to face the gas supply unit 140.

The outer tube 110 may have an inner space into which the inner reaction tube 120 in which the substrate processing process is performed is accommodated and also have an opened lower side.

The inner reaction tube 120 may be disposed to be spaced apart from the inner surface of the outer tube 110 in the inner space of the outer tube 110 and have the accommodation space into which the substrate boat 130 is loaded. The inner reaction tube 120 may have a cylindrical shape. Also, the reaction tube 114 may have an opened lower portion in a state in which an upper portion thereof is closed. When the substrate boat 130 is elevated to be loaded into the inner reaction tube 120, in which the substrate processing process is performed, the substrate boat 130 may be loaded into or unloaded from the accommodation space of the inner reaction tube 120 through an opening defined in a lower portion of the inner reaction tube 120. The lower portion of the inner reaction tube 120 may be connected to be supported by a flange part 125. However, the inner reaction tube 120 may have various structures and shapes without being limited thereto.

Also, the inner reaction tube 120 may provide a substrate processing region in which the substrate processing process is performed. The substrate boat 130 may be disposed in the substrate processing region when converted into a process position (or loaded), and the substrate processing region may be reduced in volume. In this case, a usage amount of substrate processing gas may be minimized, and also, the substrate processing gas may be concentrated onto the substrates loaded within the substrate boat 130. Here, the substrate processing gas may include a deposition gas (e.g., a source gas and a reaction gas) or an etch gas.

The inner reaction tube 120 may be made of ceramic or a material in which ceramic is applied to quartz or a metal. The exhaust holes 151 and 152 of the exhaust duct 150 may be provided in one side (or one side of a circumferential surface) at which the gas supply unit 140 is disposed and the other side (or the other side of the circumferential surface) facing the one side. Thus, a residual gas within the inner reaction tube 120 may be exhausted to the outside through the exhaust holes 151 and 152.

The plurality of substrates 10 may be loaded into the substrate boat 130 in the multi stage manner (or in a vertical direction) so as to perform the substrate processing process in a batch type manner, and the substrate boat 130 may be accommodated into the upper portion of the accommodation space of the inner reaction tube 120 when the substrate processing process is performed. Here, the substrate boat 130 may be configured to be elevatable and accommodated into the accommodation space of the inner reaction tube 120 so that the plurality of substrates 10 are loaded into the accommodation space of the inner reaction tube 120. Here, the substrate boat 130 may have a plurality of processing spaces in which the plurality of substrates 10 are individually processed.

For example, in the substrate boat 130, slots may be provided in a plurality of rods 131 in a multistage manner so that the substrates 10 are inserted to be loaded. Also, the substrate boat 130 may have a configuration in which isolation plates (not shown) are coupled to the plurality of rods 131 in the multistage manner so that the isolation plates (not shown) are disposed above or below the substrates 10 to provide an individual processing space for each substrate 10. Here, the isolation plates (not shown) may distinguish the processing spaces, in which the substrates 10 are processed, from each other. Here, the substrate 10 may be loaded to be supported by a support protrusion (not shown) disposed on the isolation plate (not shown) or may be inserted into each of the slots or support tips (not shown), which are provided in/on the plurality of rods 131. When the substrate boat 130 includes the isolation plates (not shown), the processing spaces for the substrates 10 may be individually provided in each stage (or layer) of the substrate boat 130 to prevent the processing spaces from interfering with each other.

The substrate boat 130 may be rotatable when the substrate processing process is performed, and ceramic, quartz, synthesis quartz, and the like may be used as a material of the substrate boat 130 of each of the isolation plates (not shown). However, an exemplary embodiment is not limited to the structure and shape of the substrate boat 130. For example, the substrate boat 130 may have various structures and shapes.

The pedestal 160 may be connected to a lower end of the substrate boat 130 to support the substrate boat 130. Also, the pedestal 160 may be elevated together with the substrate boat 130 and be accommodated into the lower end of the accommodation space of the inner reaction tube 120 when the substrate processing process is performed. Also, the pedestal 160 may include a plurality of thermal blocking plates 161 disposed in a multistage manner so as to be spaced apart from other. The plurality of thermal blocking plates 161 may be connected to the plurality of supports 162 and disposed in the multistage manner so as to be spaced apart from each other. Also, the plurality of thermal blocking plates 161 may be constituted by baffle plates for preventing heat from being transferred upward and downward and be made of a material (e.g., opaque quartz) having low thermal conductivity. For example, each of the thermal blocking plates 161 may have a circular plate shape, and the thermal blocking plates 161 may be fixed by the plurality of supports 161 at a predetermined interval in a vertical direction. The pedestal 160 may block heat transfer from the accommodation region of the substrate boat 130 in the accommodation space of the inner reaction tube 120 through the plurality of thermal blocking plates 161.

Also, the pedestal 160 may further include a plurality of supports 162 extending in the vertical direction and disposed to be spaced apart from each other, an upper plate 163 fixed to each of upper and lower ends of the plurality of supports 162, and a side cover 165 surrounding side surfaces (or a side surface of the pedestal) of the plurality of thermal blocking plates 161. The plurality of supports 162 may extend in the vertical direction and be disposed to be spaced apart from each other in a horizontal direction to support the plurality of thermal blocking plates 161. For example, four supports 162 may be provided, and a plurality of slots may be defined in the vertical direction so that the plurality of thermal blocking plates 161 are respectively inserted into the plurality of slots and thus supported.

The upper plate 163 may fix an upper end of each of the plurality of supports 162 and be connected to the substrate boat 130. For example, the substrate boat 130 may be placed on the upper plate 163 and then supported (or fixed). The lower plate 164 may fix a lower end of each of the plurality of supports 162 and be connected to connected to a shaft 191. For example, the pedestal 160 may be rotated by rotation of the shaft 191 connected to the lower plate 164 to rotate the substrate boat 130. Here, the plurality of supports 162, the upper plate 163, and the lower plate 164 may constitute a frame of the pedestal 160.

The side cover 165 may surround the side surfaces (or the side surface of the pedestal) of the plurality of thermal blocking plates 161 and be connected to be fixed to the upper plate 163 and/or the lower plate 164. The side cover 165 may block a flow of a gas such as the residual gas into spaces between the plurality of thermal blocking plates 161 to prevent heat from being transferred by convection through the heat insulation as well as prevent the inside of the pedestal 160 from being contaminated by the residual gas. Also, when the side cover 165 protrudes further than an edge (or a circumference) of the substrate boat 130, a phenomenon in which the substrate processing gas supplied into the inner reaction tube 120 does not reach a top surface of the substrate 10 but is exhausted through a lower portion (or between a sidewall of the inner reaction tube and a side surface of the pedestal) may be suppressed.

The pedestal 160 may block the heat transfer by the radiation as well as the heat transfer by the conduction through the plurality of thermal blocking plates 161 and also block the heat transfer by the convection through the side cover 165. Thus, the heat transfer (or heat discharge) from the accommodation region of the substrate boat 130 may be blocked to uniformly maintain a temperature in all the accommodation region (or a height) of the substrate boat 130, in which the substrate processing process is performed, and stably perform uniform substrate processing on the plurality of substrates 10.

The gas supply unit 140 may be disposed at one side of the inner reaction tube 120 to supply a process gas such as the substrate processing gas into the inner reaction tube 120. Here, the process gas may include the substrate processing gas and an inert gas. When the substrate processing space is divided, the process gas may be supplied into each of the processing spaces. Here, the process gas may be supplied into the processing spaces through a plurality of injection nozzles 142 provided in the processing spaces, respectively. Here, at least a portion of the gas supply unit 140 may be disposed in the inner reaction tube 120 to supply the process, or the process gas may be supplied into the inner reaction tube 120 through an inflow hole (not shown) passing to correspond to each of the injection nozzles 142 in the sidewall of the inner reaction tube 120. Also, the injection nozzle 142 may be inserted into the inflow hole (not shown) to pass through the sidewall of the inner reaction tube 120 so that the injection nozzle 142 is provided (or disposed) in the inner reaction tube 120.

The exhaust duct 150 may vertically extend from the other side of the inner reaction tube 120 facing one side of the inner reaction tube 120 and also provide an inner passage communicating with each of exhaust holes 151 and 152 passing through the sidewall of the inner reaction tube 120. Also, the exhaust duct 150 may be disposed in a spaced space between the inner reaction tube 120 and an outer tube 110 to face the gas supply unit 140. The exhaust duct 150 may be disposed at the other side of the inner reaction tube 120 to correspond to the gas supply unit 140, be installed on the sidewall (e.g., an outer wall) of the inner reaction tube 120, or be disposed in the spaced space between the inner reaction tube 120 and the outer tube 110. Here, the exhaust duct 150 may be disposed to face (or to be symmetrical to) the gas supply unit 140 to generate a laminar flow on the substrate.

Also, the exhaust duct 150 extends in the vertical direction to form the inner passage, through which the residual gas introduced from the inside of the inner reaction tube 120 flows, therein, and the inner passage may communicate with each of the exhaust holes 151 and 152 defined to pass through the sidewall of the inner reaction tube 120. Here, the exhaust holes 151 and 152 may be provided as one opening or a plurality of openings. Also, each of the exhaust holes 151 and 152 may have at least one circular, slit, or long hole shape.

For example, the exhaust duct 150 may have a square box shape having an inner space (i.e., the inner passage), and the residual gas introduced into the inner reaction tube 120 through the exhaust holes 151 and 152 may flow downward along the inner passage of the exhaust duct 152. Here, a lower end of the exhaust duct 150 may communicate with (or be connected to) an exhaust port 170. Thus, the exhaust duct 150 may prevent the residual gas, which may contaminate the inside of the substrate processing apparatus 100, from being diffused into the spaced space between the inner reaction tube 120 and the outer tube 110 and guide the residual gas so that the residual gas is smoothly suctioned (exhausted) into the exhaust port 170.

In accordance with the related art, the residual gas is suctioned into the exhaust port 170 via the entire spaced space between the inner reaction tube 120 and the outer tube 110. Thus, the spaced space (i.e., between an outer wall of the inner reaction tube and an inner wall of the outer tube) between the inner reaction tube 120 and the outer tube 110 may be easily contaminated by the residual gas that passes therethrough. Particularly, when an etch gas is contained in the substrate processing gas in a selective epitaxial growth (SEG) process, the etch gas may also be contained in the residual gas to contaminate equipment (e.g., the inner reaction tube and the outer tube) as well as damage the equipment by the etch gas.

Thus, in accordance with an exemplary embodiment, the residual gas suctioned into the exhaust port 170 from the spaced space between the inner reaction tube 120 and the outer tube 110 through the exhaust duct 150 may be reduced in flow area to reduce a surface area contaminated by the residual gas. That is, only the inner space (i.e., the inner passage) of the exhaust duct 150, not the entire spaced space between the inner reaction tube 120 and the outer tube 110 may be contaminated by the residual gas. Thus, when the equipment is contaminated or damaged by the residual gas, since only the exhaust duct 150 needs to be repaired, the equipment may be easily maintained or repaired.

Since the exhaust duct 150 is easily contaminated by the residual gas passing therethrough, the exhaust duct 150 may be made of a quartz material to minimize the contamination of the exhaust duct 150. Also, the exhaust duct 150 may be provided to be separated from the inner reaction tube 120 so that only the exhaust duct 150 is separated from the inner reaction tube 120 when the exhaust duct 150 is contaminated or damaged. However, the structure, shape, and material of the exhaust duct 150 are not limited thereto. Also, the exhaust duct 150 may extend up to the outside of the accommodation region of the pedestal 160 in the accommodation space of the inner reaction tube 120. That is, at least a portion of the exhaust duct 150 may be provided outside the accommodation region of the pedestal 160. When the exhaust duct 150 is provided only outside the accommodation region of the substrate boat 130, the exhaust port 170 is disposed outside the accommodation region of the substrate boat 130. As a result, a difference in exhaust rate due to a different in suction force between the region corresponding to the exhaust port 170 and the region, which does not correspond to the exhaust port 170, may occur, and a degree of the substrate processing may vary depending on a loaded position (or height) of the substrate 10, and thus, the thin film on the substrate 10 may have a non-uniform thickness.

Also, in a place, at which the exhaust rate is high, a sufficient time taken to allow the substrate processing gas to react on the substrate 10 may not be provided, and also, a difference in flow rate between the substrate processing gas passing through the intermediate area of the substrate 10 and the substrate processing gas passing through both side areas of the substrate 10 may increase to cause a difference in thin film thickness between the intermediate area and both the side areas of the substrate 10. Here, the intermediate area of the substrate 10 may be an area between the gas supply unit 140 and the exhaust duct 150 (or an area between the injection nozzle of the gas supply unit and the exhaust hole of the exhaust duct). Also, both the side areas of the substrate 10 may be areas disposed on both sides of the intermediate area of the substrate 10 except for the intermediate area of the substrate 10.

However, in accordance with an exemplary embodiment, the exhaust duct 150 may extend up to the outside of the accommodation region of the pedestal 160 so that the exhaust port 170 is installed outside the accommodation region of the pedestal 160 to reduce the difference in exhaust rate for each position (or height) due to the difference in suction force in the accommodation region of the substrate boat 130. Thus, the uniform thin film may be formed on each of the plurality of substrates 10 regardless of the position (or height) of the substrate 10. Also, the exhaust holes 151 and 152 may be defined in a position (a first exhaust hole) corresponding to the accommodation region of the substrate boat 130 as well as a position (a second exhaust hole) corresponding to the accommodation region of the pedestal 160.

The exhaust duct 150 may be adjusted in horizontal cross-sectional area (i.e., a width of the inner passage of the exhaust duct) of the exhaust duct 150 by adjusting a length in a width direction, which extends from the inner reaction tube 120 in the width direction to control the exhaust rate. The exhaust duct 150 extending in a circumferential direction of the inner reaction tube 120 may have a length in a circumferential direction thereof, which is fixed depending on a length in a circumferential direction of the gas supply unit 140 and thus is not easily changed. However, since the length of the exhaust duct 150 in the width direction is freely changed within the spaced space between the inner reaction tube 120 and the outer tube 110, the exhaust rate may be easily adjusted.

The substrate processing apparatus 100 in accordance with an exemplary embodiment may further include the exhaust port 170 communicating with the exhaust duct 150 and disposed to correspond to the accommodation region of the pedestal 160. The exhaust port 170 may communicate with the lower portion of the exhaust duct 150, for example, the exhaust port 153*b* may have both ends (or both sides) that are opened. Thus, the residual gas introduced into one end (or one side) of the exhaust port 170 communicating with the exhaust duct 150 may flow to the other side (or the other side) along the exhaust port 170 and then be discharged to the outside. For example, the residual gas may be exhausted by an exhaust pump (not shown) directly or indirectly connected to the exhaust port 170, and an exhaust tube (not shown) by which the exhaust path extends may be disposed between the exhaust port 170 and the exhaust pump (not shown).

The substrate processing apparatus 100 in accordance with an exemplary embodiment may further include a heating unit 180 vertically extending outside the inner reaction tube 120 to heat the inner reaction tube 120 and extending up to the outside of the pedestal 160. The heating unit 180 may vertically extend outside the inner reaction tube 120 to heat the inner reaction tube 120 and be disposed to surround a side surface and an upper portion of the inner reaction tube 120 or the outer tube 110. Here, the heating unit 180 may provide thermal energy to the inner reaction tube 120 or the outer tube 110 to het the accommodation space of the inner reaction tube 120 and/or the inner space of the outer tube 110. Thus, the accommodation space of the inner reaction tube 120 may be adjusted to a temperature that is adequate for the substrate processing, and particularly, the accommodation space of the inner reaction tube 120 may be adjusted to a temperature at which the epitaxial process is enabled.

Also, the heating unit 180 may extend up to the outside of the accommodation region of the pedestal 160. That is, at least a portion of the heating unit 180 may be provided outside the accommodation region of the pedestal 160. Although a heating region (or a region in which the heating unit is provided) that is close to a non-heating region (or a region in which the heating unit is not provided) is heated by the heating unit 180, the heat may be lost by thermal equilibrium (or heat exchange) due to the heat transfer (or the heat flow) to decrease in temperature rather than that of the other region. That is, the heating region corresponding to an edge portion of the heating unit 180 may have a temperature less than that of the heating region corresponding to a central portion of the heating unit 180.

However, in accordance with an exemplary embodiment, the heating unit 180 may extend up to the outside of the accommodation region of the pedestal 160 so that the heating region corresponding to the edge portion of the heating unit 180 is disposed in the accommodation region of the pedestal 160, and thus, only the heating region corresponding to the central portion of the heating unit 180 may be disposed in the accommodation region of the substrate boat 130, in which the substrate processing process is substantially performed. Therefore, the accommodation region of the substrate boat 130 may be uniformly heated on the whole, and also, the temperature of the accommodation region of the substrate boat 130 may be uniform on the whole.

Figure 2:
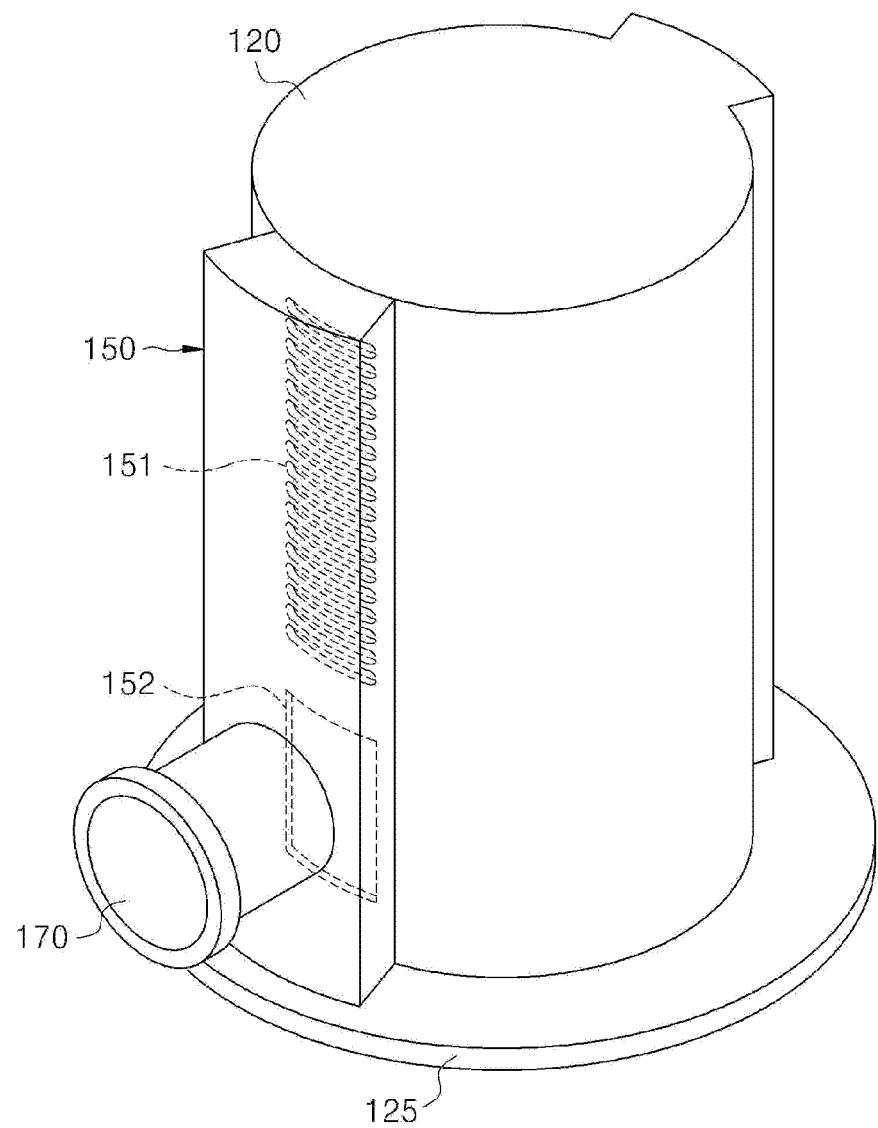
FIG. 2 is a perspective view of an inner reaction tube with which an exhaust duct is integrated in accordance with an exemplary embodiment.

FIG. 2 is a perspective view of the inner reaction tube with which the exhaust duct is integrated in accordance with an exemplary embodiment.

Referring to FIG. 2, the exhaust duct 150 may be made of quartz and integrated with the inner reaction tube 120. The exhaust duct 150 may be made of quartz. Since the inside of the exhaust duct 150 is easily contaminated by the residual gas, the exhaust duct 150 may be made of the quartz material to minimize the contamination of the exhaust duct 150. Here, the exhaust duct 150 may be manufactured to be integrated with the inner reaction tube 120.

The exhaust duct 150 may be integrated with the sidewall of the inner reaction tube 120. Since the exhaust duct 150 is made of the same material as the inner reaction tube 130 as the quartz, the exhaust duct 150 may be integrated with the inner reaction tube 120. The exhaust duct 150 may be integrated with the inner reaction tube 120 and thus easily manufactured. Also, a gap in a coupled portion between the inner reaction tube 120 and the exhaust duct 150 may be prevented from being generated. Also, leakage of the residual gas to the outside of the exhaust duct 150 may be prevented so that the residual gas is transferred from only the inner passage of the exhaust duct 150 to the exhaust port 170. Thus, the residual gas that may contaminate the inside of the substrate processing apparatus 100 may be prevented from being diffused into the spaced space between the inner reaction tube 120 and the outer tube 110, and the exhaust duct 150 may effectively guide the residual gas so that the residual gas is smoothly transferred to the exhaust port 170.

The exhaust holes 151 and 152 may include a first exhaust hole 151 defined to correspond to the accommodation region of the substrate boat 130 in the accommodation space of the inner reaction tube 120 and a second exhaust hole 152 defined to correspond to the accommodation region of the pedestal 160. The exhaust holes 151 and 152 may be provided in the sidewall of the inner reaction tube 120 and configured to allow the accommodation space of the inner reaction tube 120 to communicate with the inner passage of the exhaust duct 150. Also, the exhaust holes 151 and 152 may be defined to face the gas supply unit 140. Here, a single exhaust hole 151 may be provided, or a plurality of exhaust holes 151 and 152 may be provided.

The first exhaust hole 151 may be defined to correspond to the accommodation region of the substrate boat 130 in the accommodation space of the inner reaction tube 120 and be defined to face the injection nozzle 142 of the gas supply unit 140. For example, the first exhaust hole 151 may be provide in plurality, and the plurality of first exhaust holes 151 may be vertically arranged in a line to face the injection nozzle 142 and be symmetrical to the plurality of injection nozzles 142 with respect to a vertical central axis of the inner reaction tube 120. The first exhaust holes 151 may be provided to correspond to the processing spaces of the substrates 10, respectively. Here, the processing spaces may be divided for each substrate 10, and processing environments for each substrate may be independently created. Thus, environments within the processing space may be individually adjusted in accordance with a state of the thin film of the substrate 10 to improve quality of the thin film.

The second exhaust hole 152 may be defined to correspond to the accommodation region of the pedestal 160 and be disposed in a line with the first exhaust holes 151. The residual gas may be exhausted through the accommodation region of the pedestal 160.

If the gas within the accommodation region of the pedestal 160 is not exhausted, the residual gas or the process gas introduced into the space between the inner surface of the inner reaction tube 120 and the side portion of the substrate boat 130 may be adsorbed onto a surface of the pedestal 160 or the inner sidewall of the inner reaction tube 120 of the accommodation region of the pedestal 160 to form a thin film. Also, particles may be adsorbed onto the surface of the pedestal 160 or the inner sidewall of the inner reaction tube 120 of the accommodation region of the pedestal 160. Here, the thin film formed on the surface of the pedestal 160 or the inner sidewall of the inner reaction tube 120 of the accommodation region of the pedestal 160 may be separated to act as particles in the accommodation space of the inner reaction tube 120. In addition, the process gas and the particles adsorbed onto the surface of the pedestal 160 or the inner sidewall of the inner reaction tube 120 of the accommodation region of the pedestal 160 may act as particles in the accommodation space of the inner reaction tube 120. Thus, the substrate 10 or the thin film may be contaminated to deteriorate quality of the substrate 10 or the thin film.

However, in accordance with an exemplary embodiment, the gas within the accommodation region of the pedestal 160 may be exhausted through the second exhaust hole 152 to prevent the residual gas that may act as the particles in the accommodation space of the inner reaction tube 120 from being adsorbed onto the surface of the pedestal 160 or the inner sidewall of the inner reaction tube 120 in the accommodation region of the pedestal 160. Thus, the substrate 10 or the thin film may be prevented from being contaminated by the particles and prevented from being deteriorated in quality.

Also, since the gas within the accommodation region of the pedestal 160 is exhausted through the second exhaust hole 152, suction force through the first exhaust hole 151 may be reduced. Also, the suction force of the first exhaust hole 151 may be adjusted in accordance with a surface area of the second exhaust hole 152, and thus, the substrate processing gas may be adjusted in flow rate. As a result, a time taken to allow the substrate processing gas to react on the substrate 10 may be sufficiently provided, and the suction force of the first exhaust hole 151 may be adjusted in accordance with the surface area of the second exhaust hole 152 to adjust a thickness of the thin film to be formed. Here, the suction force of the first exhaust hole 151 may be inversely proportional to the surface area of the second exhaust hole 152.

For example, when the flow rate of the substrate processing gas is too high, and a time for which the substrate processing gas stays on the substrate 10 is short, the second exhaust hole 152 may increase in surface area to reduce the suction force of the first exhaust hole 151, thereby reducing the flow rate of the substrate processing gas. Also, when it is necessary to reduce the time for which the substrate processing gas stays on the substrate 10, the second exhaust hole 152 may decrease in surface area to increase the suction force of the first exhaust hole 151, thereby increasing the flow rate of the substrate processing gas.

Also, a horizontal flow of the gas of the first exhaust hole 151 and a flow of the gas to a lower side (i.e., the accommodation region of the pedestal) may be generated through the second exhaust hole 152 to allow the substrate processing gas to be effectively adsorbed onto the surface of the substrate 10 and allow the substrate processing gas to effectively react on the substrate 10. Therefore, the substrate processing process may be more effectively performed to effectively form the thin film on the substrate 10. Here, the downward flow may be generated through the gap between the sidewall of the inner reaction tube 120 and the side surface of the pedestal 160, and since the gap between the sidewall of the inner reaction tube 120 and the side surface of the pedestal 160 is very thin and disposed on only a circumference of the substrate 10, it may not significantly affect the horizontal flow of the substrate processing gas. As a result, the substrate processing gas may maximally approach the surface of the substrate 10 while maintaining the laminar flow.

Also, the accommodation region of the pedestal 160 may become a vacuum state through the exhaust of the gas within the accommodation region of the pedestal 160 to suppress or prevent the heat transfer due to the flow (I.e., the convection) of the gas, thereby more effectively blocking the heat transfer to the accommodation region of the pedestal 160.

When the accommodation space of the inner reaction tube 120 is in the vacuum state, the gas (or air) may be exhausted through the accommodation region of the substrate boat 130 using the first exhaust hole 151 as well as the accommodation region of the pedestal 160 using the second exhaust hole 152 to effectively generate the vacuum state in the accommodation space of the inner reaction tube 120.

Also, the first exhaust hole 151 and the second exhaust hole 152 may be spaced apart from each other. In this case, a boundary between the first exhaust hole 151 and the second exhaust hole 152 may be formed to distinguish the exhaust of the accommodation region of the substrate boat 130 through the first exhaust hole 151 from the exhaust of the accommodation region of the pedestal 160 through the second exhaust 152. Also, the exhaust of the accommodation region of the pedestal 160 through the second exhaust hole 152 may be prevented from affecting the flow of the substrate processing gas at the lower end of the accommodation region of the substrate boat 130.

Here, the second exhaust hole 152 may face the exhaust port 170. In general, since the pedestal 160 has a length (or a height) less than that of the substrate boat 130, the entire surface area of the second exhaust hole 152 may be less than that of the first exhaust hole 151. In this case, the suction force of the first exhaust hole 151 is greater than that of the second exhaust hole 152. When the second exhaust hole 152 faces the exhaust port 170, the second exhaust hole 152 may be defined to match the suction direction of the exhaust port 170 and thereby to complement the suction force of the second exhaust hole 152 that is less than that of the first exhaust hole 151 due to the relatively small opening surface area. Thus, the exhaust of the accommodation region of the pedestal 160 may be effectively performed.

When the exhaust port 170 is disposed outside the lower end of the accommodation region of the pedestal 160, the second exhaust hole 1652 may correspond to the exhaust port 170 and thus be provided in only the lower end of the accommodation region of the pedestal 160. Thus, the exhaust of the accommodation region of the substrate boat 130 and the exhaust of the accommodation region of the pedestal 160 may be reliably distinguished from each other, and the exhaust of the accommodation region of the pedestal 160 through the second exhaust hole 152, which affects the flow of the substrate processing gas at the lower end of the accommodation region of the substrate boat 130, may be minimized.

When the first exhaust hole 151 and the second exhaust hole 152 are disposed in a line, the exhaust duct 150 covering the first exhaust hole 151 and the second exhaust hole 152 may be easily provided. That is, when the first exhaust hole 151 and the second exhaust hole 152 are not disposed in a line, since the exhaust duct 150 is bent in accordance with the arrangement of the first exhaust hole 151 and the second exhaust hole 152, which are disposed to be bent, the exhaust duct 150 may be complicated in structure. Thus, when the first exhaust hole 151 and the second exhaust hole 152 are disposed in a line, the exhaust duct 150 may be simplified in structure and easily installed.

Figure 3:
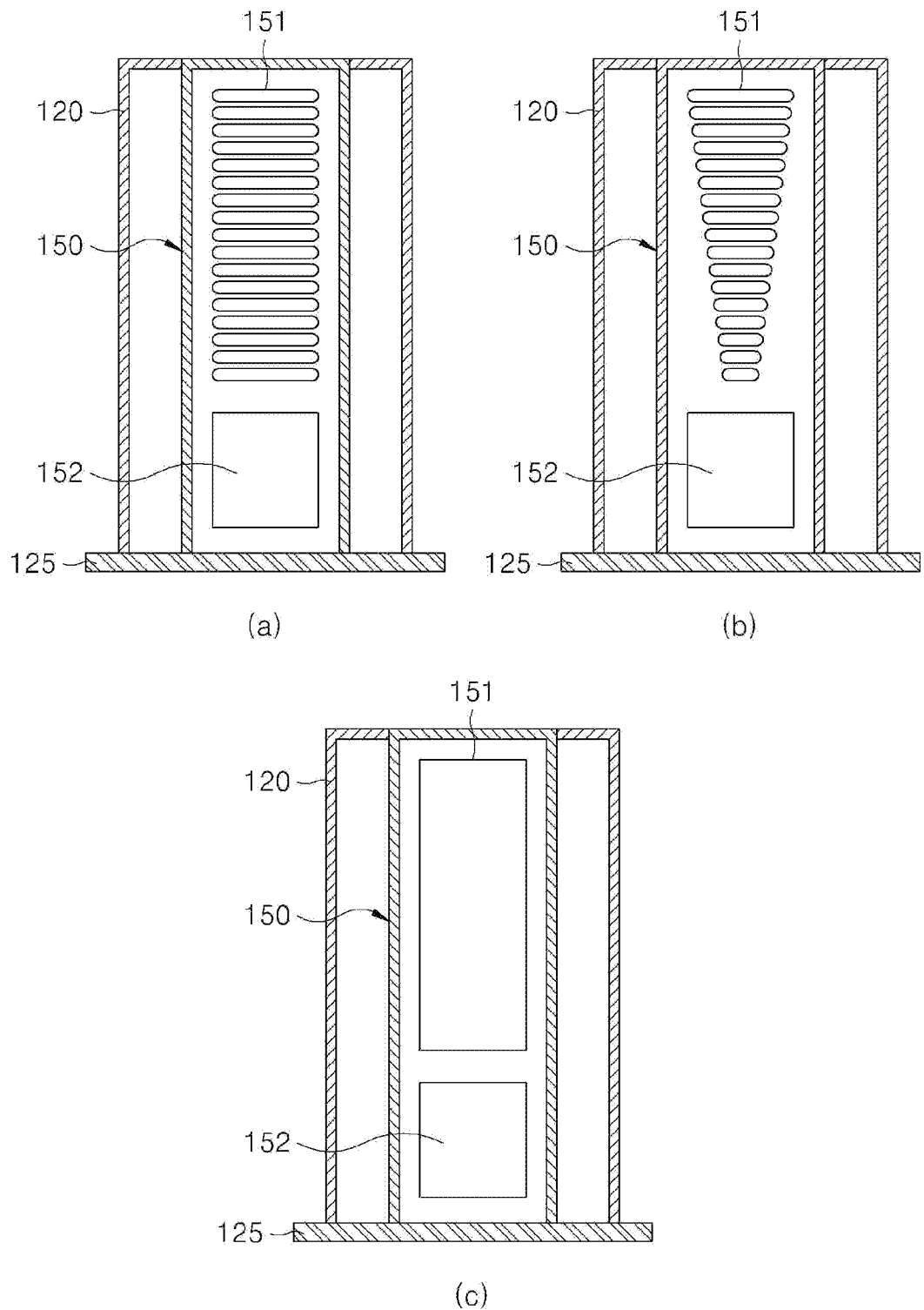
FIG. 3 is a schematic view illustrating a shape of an exhaust hole in accordance with an exemplary embodiment.

FIG. 3 is a schematic view illustrating a configuration of the exhaust hole in accordance with an exemplary embodiment, (a) of FIG. 3 is a view of a first exhaust hole having the same surface area at all heights, (b) of FIG. 3 is a view of a first exhaust having different surface areas in accordance with heights, and (c) of FIG. 3 is a view of a first exhaust hole in which a single slit is provided.

Referring to FIG. 3, the exhaust holes 151 and 152 may have a slit shape extending in a circumferential direction of the inner reaction tube 120 or a shape in which a plurality of through-holes (not shown) are arranged along the circumference of the inner reaction tube 120. The exhaust holes 151 and 152 may extend in the circumferential direction of the inner reaction tube 120 and have the slit shape. Also, the exhaust holes 151 and 152 may be provided as the plurality of through-holes (not shown) arranged in a line along the circumference of the inner reaction tube 120.

Here, a central angle between a width (or a distance) extending in the circumferential direction of the inner reaction tube 120 or a length in which the plurality of through-holes (not shown) are arranged in a line and a vertical central axis of the inner reaction tube 120 may be an angle of 10° to 35°. That is, the width (or the distance) extending in the circumferential direction of the inner reaction tube 120 or the length in which the plurality of through-holes (not shown) are arranged in a line may be a circumferential length (or an arc length) of the inner reaction tube 120 having a central angle of 10° to 35°. When the exhaust holes 151 and 152 are defined so that a central angle of each of the exhaust holes 151 and 152 with respect to the vertical central axis of the inner reaction tube 120 is less than 10°, since each of the exhaust holes 151 and 152 decreases in width, the flow of the substrate processing gas may be too fast on the intermediate area of the substrate 10 and be too slow on both side areas of the substrate 10. As a result, the substrate processing gas may be smoothly supplied to the intermediate area of the substrate 10, but may be not smoothly supplied to both the side areas of the substrate 10. Thus, the thin film may not be uniformly formed on the intermediate area and both the side areas of the substrate 10 to deteriorate the quality of the thin film.

On the other hand, when the exhaust holes 151 and 152 are defined so that a central angle with respect to the vertical central axis of the inner reaction tube 120 is greater than 35°, the substrate processing gas may not be sufficiently distributed on the substrate 10 and be directly exhausted through the exhaust holes 151 and 152, which increase in width. As a result, the substrate processing gas may be smoothly supplied to both the side areas of the substrate 10, but may not be smoothly supplied to the intermediate area of the substrate 10 in accordance with a distance (e.g., as away from the gas supply unit) from the gas supply unit 140 (i.e., from the injection nozzle of the gas supply unit). Thus, the thickness of the thin film on the intermediate area of the substrate 10 may be less than that of the thin film on each of both the side areas of the substrate 10, and the thickness of the thin film formed on the intermediate area of the substrate 10 and the thickness of the thin film formed on each of both the side areas of the substrate 10 may be different from each other to deteriorate the quality.

However, like this embodiment, when the exhaust holes 151 and 152 are defined so that a central angle of each of the exhaust holes 151 and 152 with respect to the vertical central axis of the inner reaction tube 120 ranges from 10° to 35°, the flow rate of the substrate processing gas, which flows through the intermediate area of the substrate 10, and the flow rate of the substrate processing gas, which flows through both the side areas of the substrate, may be uniform. That is, the flow rate of the substrate processing gas may be constantly maintained on the entire area on the substrate 10. Thus, the substrate processing gas may be uniformly distributed on the substrate 10 to form the thin film having a uniform thickness on the entire area of the substrate 10, thereby improving the quality of the thin film.

Also, each of the exhaust holes 151 and 152 may have a height that decreases as each of the exhaust holes 151 and 152 increases in width and also increases as each of the exhaust holes 151 and 152 decreases in width. That is, the height and the width of each of the exhaust holes 151 and 152 may be inversely proportional to each other. When the width of each of the exhaust holes 151 and 152 is excessively reduced, the surface area of each of the exhaust holes 151 and 152 may be reduced to reduce the flow rate of the residual gas that may be suctioned through the exhaust holes 151 and 152, and thus, the residual gas within the inner reaction tube 120 may not be smoothly exhausted to the outside. Thus, when each of the exhaust holes 151 and 152 has a small width, each of the exhaust holes 151 and 152 may increase in height to minimize the reduction in surface area of each of the exhaust holes 151 and 152.

On the other hand, when each of the exhaust holes 151 and 152 excessively increases in width, the substrate processing gas may not be uniformly distributed on the substrate 10 within the inner reaction tube 120 and be introduced into the exhaust holes 151 and 152, and thus, the substrate processing process may not be smoothly performed. Thus, when each of the exhaust holes 151 and 152 has a large width, each of the exhaust holes 151 and 152 may decrease in height to reduce a flow rate of a gas that may be introduced through the exhaust holes 151 and 152.

Thus, the accommodation space of the inner reaction tube 120 may be determined in width and height in consideration of a volume of the accommodation space of the inner reaction tube 120 and a flow rate of the gas. However, the structure and shape of each of the exhaust holes 151 and 152 may not be limited thereto.

Each of the exhaust holes 151 and 152 may have various structures. For example, the width of the inner reaction tube 120 in the circumferential direction of the inner reaction tube 120 may significantly increase as the exhaust holes 151 and 152 are disposed away from a portion at which the exhaust duct 150 and the exhaust port 170 are connected to each other. Here, when the exhaust port 170 is connected to the lower portion of the exhaust duct 150 to suction the residual gas downward through the inner passage of the exhaust duct 150, each of the upper exhaust holes 151 and 152 may have a size greater than that of the lower exhaust holes 151 and 152. That is, in the case of the exhaust holes 151 and 152 that are close to the exhaust port 170, large suction force may be generated due to a short distance from the exhaust port 170. In the case of the exhaust holes 151 and 152 that are far from the exhaust port 170, weak suction force may be generated due to the a long distance from the exhaust port 170. Thus, a difference in suction force of the gas within the inner reaction tube 120 may be minimized in accordance with the height by adjusting the size of each of the exhaust holes 151 and 152.

The substrate processing apparatus 100 in accordance with an exemplary embodiment may further include a chamber 190 including an upper chamber 190a and a lower chamber 190b, which communicate with each other, a shaft 191 connected to a lower plate 164 of the pedestal 160, an elevation driving unit 192 connected to a lower end of the shaft 191 to vertically move the shaft 191, a rotation driving unit 193 connected to the lower end of the shaft 191 to rotate the shaft 191, a support plate 194 connected to an upper end of the shaft 191 so as to be elevated together with the substrate boat 130, a sealing member 194a disposed between the inner reaction tube 120 or the outer tube 110 and the support plate 194, a bearing member 194b disposed between the support plate 194 and the shaft 191, and an insertion hole 105 through which the substrate 10 is loaded into the chamber 190.

The chamber 190 may have a square box or cylindrical shape, and the outer tube 110 and the inner reaction tube 120 may be disposed in the chamber 190. The chamber 190 may include the upper chamber 190a and the lower chamber 190b, which communicate with each other.

The shaft 191 may be connected to the lower plate 164 of the pedestal 160 and support the pedestal 160 and/or the substrate boat 130.

The elevation driving unit 192 may be connected to the lower end of the shaft 191 to vertically move the shaft 191, and thus, the substrate boat 130 may be elevated.

The rotation driving unit 193 may be connected to the lower end of the shaft 191 to rotate the substrate boat 130 and also may rotate the shaft 191 to rotate the substrate boat 130 by using the shaft 191 as a central axis.

The support plate 194 may be connected to the upper end of the shaft 91 so as to be elevated together with the substrate boat 130. When the substrate boat 130 is accommodated into the accommodation space of the inner reaction tube 120, the support plate 194 may seal the accommodation space of the inner reaction tube 120 and/or the inner space of the outer tube 110 from the outside.

The sealing member 194a may be disposed between the support plate 194 and the inner reaction tube 120 and/or between the support plate 194 and the outer tube 110 to seal the accommodation space of the inner reaction tube 120 and/or the inner space of the outer tube 110.

The bearing member 194b may be disposed between the support plate 194 and the shaft 191 and rotated in the state in which the shaft 191 is supported by the beating member 194b.

The insertion hole 195 may be provided in one side of the chamber 190 (e.g., one side of the lower chamber), and the substrate 10 may be loaded from a transfer chamber 200 into the chamber 190 through the insertion hole 195. An inflow hole 210 may be defined in one side of the transfer chamber, which corresponds to the insertion hole 195 of the chamber 190. A gate value 250 may be disposed between the inflow hole 210 and the insertion hole 195. Thus, the inside of the transfer chamber 200 and the inside of the chamber 190 may be isolated from each other by the gate valve 250, and the inflow hole 210 and the insertion hole 195 may be opened and closed by the gate valve 250.

The substrate processing apparatus 100 may further include a baffle 153 including an opening and installed in the exhaust duct 150. The baffle 153 may include the opening, be installed in the exhaust duct 150, and be disposed to correspond to a boundary between the accommodation region of the substrate boat 130 and the accommodation region of the pedestal 160. Here, the baffle 153 may be disposed in the inner passage of the exhaust duct 150, and the opening may be provided as a single hole or a plurality of holes. The inner passage of the exhaust duct 150 corresponding to the accommodation region of the substrate boat 130 and the inner passage of the exhaust duct 150 corresponding to the accommodation region of the pedestal 160 may be divided by the baffle 153, and an exhaust rate and/or flow rate in the accommodation region of the substrate boat 130 may be adjusted in accordance with a surface area of the opening (or an opened surface area).

For example, when the opened surface area of the baffle 153 is small, the flow rate passing through the baffle 153 may decrease, and thus, the exhaust rate in the accommodation region of the substrate boat 130 may decrease. Also, when the opened surface area of the baffle 153 increases, the flow rate passing through the baffle 153 may increase, and thus, the exhaust rate in the accommodation region of the substrate boat 130 may increase. Thus, the exhaust rate and/or the flow rate in the accommodation region of the substrate boat 130 may be simply adjusted to effectively control the flow of the substrate processing gas on the substrate 10.

The baffle 153 may vary in position between the first exhaust hole 151 and the second exhaust hole 152. When the baffle 153 is disposed far away from the first exhaust hole 151, suction force of the first exhaust hole 151 may be relatively weaker than that the case in which the baffle 153 is disposed close to the first exhaust hole 151. When the baffle 153 is disposed close to the first exhaust hole 151, the suction force of the first exhaust hole 151 may be relatively stronger than that the case in which the baffle 153 is disposed far away from the first exhaust hole 151. Thus, the baffle 153 may be appropriately disposed between the first exhaust hole 151 and the second exhaust hole 152 as necessary.

Figure 4:
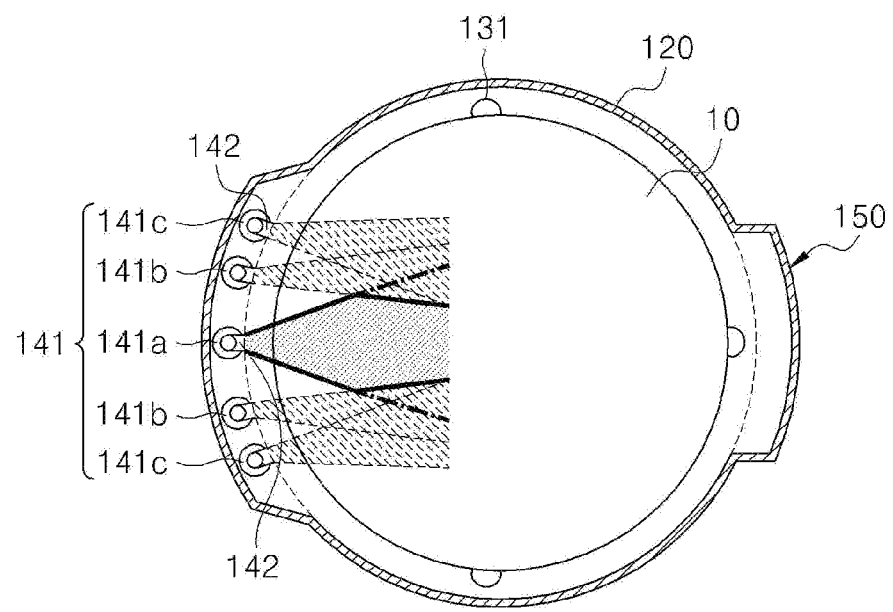
FIG. 4 is a conceptual view for explaining a flow control of a substrate processing gas through an inert gas in accordance with an exemplary embodiment.

FIG. 4 is a conceptual view for explaining a flow control of the substrate processing gas through the inert gas in accordance with an exemplary embodiment.

Referring to FIG. 4, the gas supply unit 140 may include a plurality of gas distribution lines 141 extending in the vertical direction to distribute the supplied substrate processing gas or inert gas. The plurality of gas distribution lines 141 may be arranged in a line along the circumference of the inner reaction tube 120 to form a gas distribution line array, and the inert gas may be supplied to the plurality of gas distribution lines 141b or 141c, which are symmetrical to each other with respect to a center of the gas distribution line array.

The plurality of gas distribution lines 141 may extend in the vertical direction and disposed in parallel to the sidewall of the inner reaction tube 120. Each of the plurality of gas distribution lines 141 may have one end (or one side) connected to a gas supply source (not shown) to supply the process gas including the substrate processing gas or the inert gas. Here, the plurality of gas distribution lines 141 may be disposed inside or outside the inner reaction tube 120. Here, when the plurality of gas distribution lines 141 are disposed inside the inner reaction tube 120, at least a portion of the sidewall of the inner reaction tube 120 may protrude to form an accommodation space (or an accommodation region) of the plurality of gas distribution lines 141. In this case, the plurality of gas distribution lines 141 or injection nozzles 152 of the plurality of gas distribution lines 141 may be maximally close to the substrate 10, and also, a distance between an inner surface of the inner reaction tube 120 in the other region except for the accommodation region of the plurality of gas distribution lines 141 and a side portion of the substrate boat 130 is not too large. Thus, the process gas may be supplied to the entire area of the substrate 10 while the overall size of the inner reaction tube 120 does not excessively increase. Here, the gas distribution lines 141 may be disposed in a line along the circumference of the substrate 10.

Also, the plurality of gas distribution lines 141 may vertically distribute the supplied substrate processing gas or inert gas (i.e., the process gas) to generally maintain a uniform pressure regardless of a height thereof. Here, the substrate processing gas and the inert gas may be separated from each other so as to be respectively supplied into the different gas distribution lines 141 or may be mixed with each other so as to be supplied into the same gas distribution line 141.

Also, the plurality of gas distribution lines 141 may be disposed in a line along the circumference of the inner reaction tube 120 to form the gas distribution line array. Here, the gas distribution lines 141, to which the inert gas is supplied, of the plurality of gas distribution lines 141 may be disposed symmetrical to each other with respect to the center of the gas distribution line array. The plurality of gas distribution lines 141 may be disposed in a line along the circumference of the inner reaction tube 120 to form the gas distribution line array. Here, the inert gas may be supplied to the plurality of gas distribution lines 141b or 141c, which are symmetrical to each other with respect to the center of the gas distribution line array. That is, the gas distribution lines 141, to which the inert gas is supplied, of the plurality of gas distribution lines 141 may be disposed symmetrical to each other with respect to the center of the gas distribution line array. Here, the gas distribution lines 141, to which the inert gas is supplied, of the plurality of gas distribution lines 141 may be disposed symmetrical to each other on both outer sides of the gas distribution line array, and the gas distribution lines 141c or 141b disposed on both outer sides of the plurality of gas distribution lines 141 may be gas distribution lines to which the inert gas is supplied. In this case, the substrate processing gas supplied from a central region of the gas distribution line array may be concentrated into the inside of the substrate 10 by the inert gas supplied to both the outer sides, and the gas distribution lines 141 to which the inert gas is supplied may be disposed symmetrical to each other to form a laminar flow on the substrate.

The substrate processing gas may be supplied to the gas distribution lines 141a or 141b, which are disposed between the plurality of gas distribution lines 141b or 141c that are symmetrical to each other. That is, the gas distribution lines 141, to which the inert gas is supplied, of the plurality of gas distribution lines 141 may be symmetrically disposed on both sides of the gas distribution lines to which the substrate processing gas is supplied. For example, the gas distribution line 141a disposed at a center of the plurality of gas distribution lines 141 may be a gas distribution line 141 to which the substrate processing gas is supplied. Here, the inert gas injected to both the sides may concentrate the substrate processing gas injected from the central portion into the inside of the substrate 10, and the gas distribution lines 141 to which the inert gas is supplied may be symmetrically disposed to form the laminar flow on the substrate. Also, straightness of the substrate processing gas may be improved, and thus, the substrate processing gas may be injected up to the central portion of the substrate 10 and uniformly supplied (or transferred) over the entire region of the substrate 10 through the rotation of the substrate 10.

That is, when the inert gas on both the sides does not concentrate the substrate processing gas to the inside of the substrate 10, the substrate processing gas may be injected to be widely spread, but the substrate processing gas may not be injected far away and thus not approach the central portion of the substrate 10. As a result, a large amount of substrate processing gas may be supplied to only a portion near the gas distribution line 141 to form the thin film having a thick thickness. Also, when the substrate 10 is rotated during the substrate processing, the substrate processing gas may be supplied to the edge portion of the substrate 10 to form the thin film in which a thickness of the edge portion of the substrate 10 is greater than that of the central portion of the substrate 10.

However, in accordance with an exemplary embodiment, the substrate processing gas may be injected up to the central portion of the substrate 10 by improving the straightness of the substrate processing gas through the concentration of the substrate processing gas to the inside of the substrate 10. Also, the substrate processing gas may be uniformly supplied to the entire area of the substrate 10 through the rotation of the substrate 10 to form a uniform thin film on the entire area of the substrate 10.

Also, in accordance with an exemplary embodiment, the substrate processing gas may be exhausted to a space between the inner surface of the inner reaction tube 120 and the side portion of the substrate boat 130 because the substrate processing gas is exhausted also to the accommodation region of the pedestal 160. Thus, the substrate processing gas may be concentrated into the inside of the substrate 10 through the inert gas injected from both the sides to prevent the substrate processing gas from being exhausted to the space between the inner surface of the inner reaction tube 120 and the side portion of the substrate boat 130.

When the circumferential length of each of the exhaust holes 151 and 152 is too larger, the substrate processing gas may not be sufficiently distributed on the substrate 10 and be directly exhausted through the exhaust holes 151 and 152, which increase in width. In this case, the substrate processing gas may be smoothly supplied to both side areas of the substrate 10, but may not be smoothly supplied to the intermediate area of the substrate 10 in accordance with a distance from the gas supply unit 140. Thus, the substrate processing gas may be concentrated to be smoothly supplied to the intermediate area of the substrate 10 regardless of the distance from the gas supply unit 140. Thus, the uniform thin film may be formed without causing a difference in thickness of the thin film formed on the intermediate area of the substrate 10 and the thin film formed on each of both the side areas of the substrate 10 in accordance with the circumferential length of the exhaust holes 151 and 152.

The flow rate of the inert gas may be adjusted in accordance with the distance between the inner surface of the inner reaction tube 120 and the side portion (or the side surface of the substrate) of the substrate boat 130. For example, when the distance between the inner surface of the inner reaction tube 120 and the side portion of the substrate boat 130 is large, the substrate processing gas may be exhausted through the space between the inner surface of the inner reaction tube 120 and the side portion of the substrate boat 130. Thus, the flow rate of the inert gas may increase to prevent the substrate processing gas from being exhausted through the space between the inner surface of the inner reaction tube 120 and the side portion of the substrate boat 130. Also, when the distance between the inner surface of the inner reaction tube 120 and the side portion of the substrate boat 130 is narrow, since the space between the inner surface of the inner reaction tube 120 and the side portion of the substrate boat 130, through which the substrate processing gas may be exhausted, is narrow, the flow rate of the inert gas may be reduced.

When the distance between the inner surface of the inner reaction tube 120 and the side portion of the substrate boat 130 is large, a large amount of substrate processing gas may be exhausted through the space between the inner surface of the inner reaction tube 120 and the side portion of the substrate boat 130. Thus, the flow rate of the inert gas may be reduced to relatively increase a concentration of the substrate processing gas. When the distance between the inner surface of the inner reaction tube 120 and the side portion of the substrate boat 130 is small, a small amount of substrate processing gas may be exhausted through the space between the inner surface of the inner reaction tube 120 and the side portion of the substrate boat 130. Thus, the flow rate of the inert gas may increase to relatively decrease a concentration of the substrate processing gas. However, a method of supplying the substrate processing gas and the inert gas through the plurality of gas distribution lines 141 may not be limited thereto, but may vary.

The substrate processing gas may include a source gas for forming the thin film and a reaction gas reacting with the source gas, and each of the source gas and the reaction gas may be a deposition gas. The source gas may be adsorbed on the substrate 10 to form a thin film and may include a metalloid such as silicon (Si) or a metal element. The reaction gas may react with the source gas to form the thin film on the substrate 10 and may include oxygen (O), nitrogen (N), and the like.

The source gas and the reaction gas may be sequentially supplied, and the source gas may be first injected onto the substrate 10 to form a single molecular layer of the source gas on the substrate 10. Next, the reaction gas may be injected onto the single molecular layer of the source gas to react with the single molecular layer of the source gas and thereby to form an atomic layer thin film. Here, the source gas may be injected onto the substrate 10 and chemically or physically adsorbed on the surface of the substrate 10, and the reaction gas may be injected onto the substrate 10 to react with the source gas adsorbed on the substrate 10 to form the atomic layer thin film. That is, the substrate processing apparatus 100 in accordance with an exemplary embodiment may perform an atomic layer deposition (ALD) process on the plurality of substrates 10.

Also, the source gas and the reaction gas may be separated to be supplied to the different gas distribution lines 141, the source gas and the reaction gas may be injected at the same time, or the source gas and the reaction gas may be injected sequentially. In this case, the source gas and the reaction gas may be prevented from reacting with each other in the gas distribution line 141. Thus, the injection nozzle 142 may be prevented from being clogged by the contamination and contaminants (i.e., the reaction material of the source gas and the reaction gas) of the inside of the gas distribution line 141 due to the reaction between the source gas and the reaction gas.

For example, the source gas may be supplied to the gas distribution line 141a disposed at the center of the plurality of gas distribution lines 141, and the reaction gas may be supplied to the gas distribution lines 141b disposed on both sides of the gas distribution line 141a to which the source gas is supplied. On the contrary, the source gas may be supplied to the gas distribution line 141a disposed at the center of the plurality of gas distribution lines 141, and the reaction gas may be supplied to the gas distribution lines 141b disposed on both the sides of the gas distribution line 141a to which the source gas is supplied. That is, one of the source gas and the reaction gas may be supplied to a large number of gas distribution lines 141 (for example, one more) when compared with the other gas, and the gas supplied to a relatively large number of gas distribution lines 141 may be supplied together with the inert gas.

In this case, a concentration of the gas supplied to the relatively large number of gas distribution lines 141 may be adjusted through the inert gas to match a concentration ratio with the gas supplied to a relatively small number of gas distribution lines 141. Also, when the source gas and the reaction gas are injected at the same time, and the source gas is supplied to the gas distribution line 141a disposed at the center of the plurality of gas distribution lines 141, it may serve to concentrate the source gas that is necessary for forming the thin film to the inside of the substrate 10.

The gas supply unit 140 may be disposed on the circumferential surface of the gas distribution line 141 and may further include a plurality of injection nozzles 142 arranged in a line along a longitudinal direction of the gas distribution line 141. An internal pressure difference of the gas distribution line 141 in the longitudinal direction may be within a predetermined range (or a predetermined error range) during the substrate processing.

The plurality of injection nozzles 142 may be disposed on the sidewall of the gas distribution line 141 and may be arranged in a line in the longitudinal direction (i.e., in the vertical direction) of the gas distribution line 141. Each of the injection nozzles 142 may be disposed to correspond to each of the substrates 10. Here, the plurality of injection nozzles 142 may be disposed toward the inside of the inner reaction tube 120 and have injection holes defined in the sidewall of the gas distribution line 141. Also, the plurality of linearly arranged injection nozzles 142 may be disposed so that a diameter of an opening thereof increases as arranged at a long distance from the gas supply source (not shown). That is, the injection nozzle 142 disposed at the upper side may have a diameter greater than that of the injection nozzle 142 disposed at the lower side. The process gas is supplied upward. Thus, since it is difficult to supply the process gas to the injection nozzle 142 disposed at the upper side rather than the injection nozzle 142 disposed at the lower side, the process gas may be uniformly supplied from all the plurality of injection nozzles 142.

An opening area of the injection nozzle 142 may be less than the internal cross-sectional area of the gas distribution line 141, and the opening area of the injection nozzle 142 may be significantly less than the internal cross-sectional area of the gas distribution line 141. In this case, the process gas may be supplied to the gas distribution line 141 and spread up to an upper end (or upper side) of the gas distribution line 141 as a whole without almost leaking to the lower injection nozzle 142. Also, the inside of the gas distribution line 141 may be maintained at an overall uniform pressure within a predetermined range regardless of the height. Thus, the straightness of the process gas injected through the injection nozzle 142 may be improved. Also, since the process gas is injected at a uniform pressure, an amount of process gas injected in proportion to the diameters of the plurality of injection nozzles 142 may be adjusted, and when the diameters of the plurality of injection nozzles 142 are all the same, a uniform amount of process gas may be supplied for each substrate 10.

Here, the opening area of the injection nozzle 142 may decrease as the number of injection nozzles 142 increases, and the internal cross-sectional area of the gas distribution line 141 may be smaller than a value obtained by being divided by the number of injection nozzles 142, i.e., may be less than 5% of the internal cross-sectional area of the gas distribution line 141. Here, when the opening area of the injection nozzle 142 is greater than 5% of the internal cross-sectional area of the gas distribution line 141, the process gas supplied to the gas distribution line 141 may leak to the lower injection nozzle 142, and thus, the inside of the gas distribution line 141 may not be maintained at the uniform pressure throughout.

The internal pressure difference of the gas distribution line 141 in the longitudinal direction may be within a predetermined range during the substrate processing. The predetermined range may be +/−5% of a mean internal pressure of the gas distribution line 141. In this case, the straightness of the process gas injected through the injection nozzle 142 may be improved. Thus, the process gas may be injected up to the central portion of the substrate 10, and also, the process gas may be injected at a uniform pressure to supply a uniform amount of process gas for each substrate 10.

Thus, in accordance with an exemplary embodiment, the internal pressure of the gas distribution line 141 may be uniform within a predetermined range at all the positions of the plurality of injection nozzles 142 during the substrate processing. Thus, the straightness of the process gas injected through the injection nozzle 142 may be improved so that the process gas is injected up to the central portion of the substrate 10. Also, the process gas may be injected at the uniform pressure so that the uniform amount of process gas is supplied to each substrate 10.

As described above, in accordance with the exemplary embodiment, the laminar flow may be formed on the substrate through the gas supply unit and the exhaust duct, which face each other, and the flow of the substrate processing gas supplied onto the substrate may be controlled. That is, the substrate processing gas above the intermediate area of the substrate, above which the flow rate of the substrate processing gas in accordance with the related art is fast, may be controlled to decrease in flow rate when compared with that of the substrate processing gas in accordance with the related art, and the substrate processing gas above both side areas of the substrate, above which the flow rate of the substrate processing gas is slow in accordance with the related art, may be controlled to increase in flow rate when compared with that of the substrate process gas in the accordance with the related art. Thus, the substrate processing gas may uniformly flow on the entire area of the substrate so that the substrate processing gas is uniformly distributed on the entire area of the substrate. Therefore, when the thin film is formed on the substrate by using the substrate processing gas, the thin film having the uniform thickness may be formed on the entire area of the substrate to improve the qualities of the produced thin film and the substrate on which the thin film is formed. Also, the exhaust hole formed in the sidewall of the inner reaction tube to communicate with the inner passage of the exhaust duct may be provided in the accommodation region of the pedestal as well as the accommodation region of the substrate boat to prevent the residual gas, which may serve as the particles in the accommodation space of the inner reaction tube, from being adsorbed onto the surface of the pedestal. Also, since the gas distribution line supplying the inert gas is symmetrically disposed about the gas distribution line supplying the substrate process gas, the substrate processing gas may be concentrated inside the substrate through the inert gas injected from both sides to improve straightness of the substrate processing gas. Therefore, the substrate processing gas may be injected up to the central portion of the substrate. The outer tube or the inner tube may be prevented from contaminated by the residual gas through the exhaust duct. That is, the moving path of the residual gas, which contaminates the outer tube or the inner tube, may be limited to the inner passage of the exhaust duct to prevent the outer tube or the inner tube from being contaminated by the residual gas. Therefore, the outer tube or the inner tube may be easily maintained and repaired.

In the apparatus for processing the substrate in accordance with the exemplary embodiment, the laminar flow may be formed on the substrate through the gas supply unit and the exhaust duct, which face each other, and the flow of the substrate processing gas supplied onto the substrate may be controlled. That is, the substrate processing gas above the intermediate area of the substrate, above which the flow rate of the substrate processing gas in accordance with the related art is fast, may be controlled to decrease in flow rate when compared with that of the substrate processing gas in accordance with the related art, and the substrate processing gas above both side areas of the substrate, above which the flow rate of the substrate processing gas is slow in accordance with the related art, may be controlled to increase in flow rate when compared with that of the substrate process gas in the accordance with the related art. Thus, the substrate processing gas may uniformly flow on the entire area of the substrate so that the substrate processing gas is uniformly distributed on the entire area of the substrate. Therefore, when the thin film is formed on the substrate by using the substrate processing gas, the thin film having the uniform thickness may be formed on the entire area of the substrate to improve the qualities of the produced thin film and the substrate on which the thin film is formed.

Also, the exhaust hole formed in the sidewall of the inner reaction tube to communicate with the inner passage of the exhaust duct may be provided in the accommodation region of the pedestal as well as the accommodation region of the substrate boat to prevent the residual gas, which may serve as the particles in the accommodation space of the inner reaction tube, from being adsorbed onto the surface of the pedestal.

Also, since the gas distribution line supplying the inert gas is symmetrically disposed about the gas distribution line supplying the substrate process gas, the substrate processing gas may be concentrated inside the substrate through the inert gas injected from both sides to improve straightness of the substrate processing gas. Therefore, the substrate processing gas may be injected up to the central portion of the substrate.

The outer tube or the inner tube may be prevented from contaminated by the residual gas through the exhaust duct. That is, the moving path of the residual gas, which contaminates the outer tube or the inner tube, may be limited to the inner passage of the exhaust duct to prevent the outer tube or the inner tube from being contaminated by the residual gas. Therefore, the outer tube or the inner tube may be easily maintained and repaired.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

What is claimed is:
1. An apparatus for producing a substrate, comprising:
an outer tube having an inner space;
an inner reaction tube disposed to be spaced apart from an inner surface of the outer tube in the inner space of the outer tube and having an accommodation space therein;
a substrate boat in which a plurality of substrates are loaded in a multistage manner and accommodated in an upper portion of the accommodation space of the inner reaction tube during substrate processing;
a pedestal configured to support the substrate boat and accommodated in a lower portion of the accommodation space of the inner reaction tube during the substrate processing;
a gas supply unit disposed on one side of the inner reaction tube;
an exhaust duct vertically extending from the other side of the inner reaction tube to provide an inner passage communicating with an exhaust hole defined to pass through a sidewall of the inner reaction tube and disposed in a spaced space between the inner reaction tube and the outer tube to face the gas supply unit;
a baffle comprising an opening and disposed in the inner passage of the exhaust duct to correspond to a boundary between an accommodation region of the substrate boat and an accommodation region of the pedestal in the accommodation space of the inner reaction tube; and an exhaust port communicating with a lower portion of the exhaust duct and disposed outside the exhaust duct to correspond to the accommodation region of the pedestal, wherein the exhaust duct extends up to an outside of the accommodation region of the pedestal, and wherein the exhaust hole comprises:

a first exhaust hole defined to correspond to the accommodation region of the substrate boat; and a second exhaust hole defined to correspond to the accommodation region of the pedestal and disposed at the other side of the inner reaction tube, wherein the second exhaust hole faces the exhaust port.

2. The apparatus of claim 1, wherein the first exhaust hole and the second exhaust hole are defined to be spaced apart from each other.

3. The apparatus of claim 1, wherein the exhaust hole has a slit shape extending in a circumferential direction of the inner reaction tube or a shape in which a plurality of through-holes are arranged along a circumference of the inner reaction tube.

4. The apparatus of claim 1, further comprising a heating unit vertically extending outside the inner reaction tube to heat the inner reaction tube and extending up to the outside of the accommodation region of the pedestal.

5. The apparatus of claim 1, wherein the pedestal comprises a plurality of thermal blocking plates spaced apart from each other and disposed in a multistage manner.

6. The apparatus of claim 1, wherein the gas supply unit comprises a plurality of gas distribution lines vertically extending to distribute a supplied substrate processing gas or inert gas, the plurality of gas distribution lines are disposed in a line along a circumference of the inner reaction tube to form a gas distribution line array, and the inert gas is supplied to the plurality of gas distribution lines, which are symmetrical to each other with respect to a center of the gas distribution line array.

7. The apparatus of claim 6, wherein the substrate processing gas is supplied to the gas distribution line disposed between the plurality of gas distribution lines, which are symmetrical to each other.

8. The apparatus of claim 6, wherein a flow rate of the inert gas is adjusted in accordance with a distance between an inner surface of the inner reaction tube and a side portion of the substrate boat.

9. The apparatus of claim 6, wherein the substrate processing gas comprises a source gas for forming a thin film and a reaction gas reacting with the source gas, and the source gas and the reaction gas are sequentially supplied.

10. The apparatus of claim 6, wherein the substrate processing gas comprises a source gas for forming a thin film and a reaction gas reacting with the source gas, and the source gas and the reaction gas are separated from each other so as to be respectively supplied to the gas distribution lines different from each other.

11. The apparatus of claim 6, wherein the gas supply unit further comprises a plurality of injection nozzles disposed on a circumferential surface of the gas distribution line and disposed in a line in a longitudinal direction of the gas distribution line, and an internal pressure difference of the gas distribution line in the longitudinal direction is within a predetermined range during the substrate processing.

12. The apparatus of claim 1, wherein a material of the exhaust duct comprises quartz, and the exhaust duct and the inner reaction tube are provided as one body.

* * * * *